(12) United States Patent
Huang et al.

(10) Patent No.: US 10,964,727 B2
(45) Date of Patent: Mar. 30, 2021

(54) FLEXIBLE ARRAY SUBSTRATE, WITH PROTECTION LAYER, PREPARATION METHOD THEREOF, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Peng Huang, Beijing (CN); Shuquan Yang, Beijing (CN); Song Wang, Beijing (CN); Yanxin Wang, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

(*) Notice: Subject to any disclaimer, the term of this patent is extended or adjusted under 35 U.S.C. 154(b) by 0 days.

(21) Appl. No.: 16/133,313

(22) Filed: Sep. 17, 2018

(65) Prior Publication Data

US 2019/0088685 A1 Mar. 21, 2019

(30) Foreign Application Priority Data

Sep. 15, 2017 (CN) .......................... 201710840811.6

(51) Int. Cl.
*H01L 27/12* (2006.01)
*H01L 51/00* (2006.01)
(Continued)

(52) U.S. Cl.
CPC ........ *H01L 27/1244* (2013.01); *H01L 27/124* (2013.01); *H01L 27/127* (2013.01);
(Continued)

(58) Field of Classification Search
CPC ............ G09G 2380/02; H01L 51/0097; H01L 2251/5338; H01L 27/1218; H01L 27/1262;
(Continued)

(56) References Cited

U.S. PATENT DOCUMENTS

2010/0252307 A1* 10/2010 Mo ...................... H05K 1/0281
174/254
2015/0382446 A1* 12/2015 Kwon ..................... G06F 3/044
174/251
(Continued)

FOREIGN PATENT DOCUMENTS

CN 105474290 A 4/2016
CN 106684115 A 5/2017
(Continued)

OTHER PUBLICATIONS

Notification of the First Office Action issued in Chinese Patent Application No. 201710840811.6, dated Jul. 18, 2019; with English translation.

*Primary Examiner* — Laura M Menz
*Assistant Examiner* — Candice Chan
(74) *Attorney, Agent, or Firm* — McDermott Will & Emery LLP

(57) ABSTRACT

A flexible array substrate includes an active area and a bending area. The bending area is adjacent to the active area. The bending area includes a protection layer and at least one signal line disposed on the base substrate. The protection layer is located on the at least one signal line at a side away from the base substrate. An orthographic projection of the protection layer on the base substrate has an overlapping region with an orthographic projection of the at least one signal line on the base substrate, the Young modulus of the
(Continued)

protection layer is larger than or equal to the Young modulus of the at least one signal line.

10 Claims, 5 Drawing Sheets

(51) Int. Cl.
*H01L 27/32* (2006.01)
*G02F 1/1333* (2006.01)
*H01L 51/52* (2006.01)
*G02F 1/1362* (2006.01)

(52) U.S. Cl.
CPC ...... *H01L 27/1218* (2013.01); *H01L 27/1262* (2013.01); *H01L 27/3276* (2013.01); *H01L 27/3297* (2013.01); *H01L 51/0097* (2013.01); *G02F 1/133305* (2013.01); *G02F 1/136286* (2013.01); *H01L 27/3244* (2013.01); *H01L 51/5253* (2013.01)

(58) Field of Classification Search
CPC . H01L 27/127; H01L 27/124; H01L 27/3244; H01L 27/3297; H01L 27/3276
See application file for complete search history.

(56) References Cited

U.S. PATENT DOCUMENTS

| | | | |
|---|---|---|---|
| 2016/0109998 A1* | 4/2016 | Watanabe | G06F 3/0412 |
| | | | 349/12 |
| 2016/0252792 A1* | 9/2016 | Han | G02F 1/1345 |
| | | | 257/774 |
| 2017/0338296 A1 | 11/2017 | Yamazaki et al. | |
| 2018/0248139 A1 | 8/2018 | Zhai et al. | |

FOREIGN PATENT DOCUMENTS

| | | |
|---|---|---|
| CN | 106816459 A | 6/2017 |
| CN | 106952937 A | 7/2017 |
| CN | 106971671 A | 7/2017 |

* cited by examiner

FLEXIBLE ARRAY SUBSTRATE, WITH PROTECTION LAYER, PREPARATION METHOD THEREOF, AND DISPLAY DEVICE

CROSS-REFERENCE TO RELATED APPLICATION

This application claims priority to Chinese Patent Application No. 201710840811.6, filed on Sep. 15, 2017, titled "FLEXIBLE ARRAY SUBSTRATE, PREPARATION METHOD THEREOF, AND DISPLAY DEVICE", which is incorporated herein by reference in its entirety.

TECHNICAL FIELD

The present disclosure relates to a display technical filed, in particular, to an array substrate, the preparation method thereof, and a display device.

BACKGROUND

Due to the characteristic of lighting and thinning, portability, and bendability, flexible display devices are more and more used in the field of wearable device, and electronic paper.

SUMMARY

A first aspect of present disclosure provides a flexible array substrate, comprising an active area and a bending area; the bending area is adjacent to the active area, the bending area comprises a protection layer and at least one signal line disposed on the base substrate, the protection layer is located on the at least one signal line at a side away from the base substrate; an orthographic projection of the protection layer on the base substrate has an overlapping region with an orthographic projection of the at least one signal line on the base substrate, the Young's modulus of the protection layer is larger than or equal to the Young's modulus of the at least one signal line.

In some embodiments, the protection layer comprises at least one protection line having an extension direction coincided with that of the at least one signal line.

In some embodiments, the orthographic projection of the boundary of the at least one protection line on the base substrate is located in the orthographic projection of the at least one signal line on the base substrate.

In some embodiments, the at least one signal line comprises at least one first signal line and at least one second signal line located on different layers, the at least one first signal line is located on the at least one second signal line at a side adjacent to the base substrate.

In some embodiments, the orthographic projection of one protection line on the base substrate is located in the orthographic projection of one of the first signal line on the base substrate, and/or the orthographic projection of one protection line on the base substrate is located in the orthographic projection of the adjacent two first signal lines on the base substrate respectively, and/or the orthographic projection of the adjacent two protection lines on the base substrate is located in the orthographic projection of one of the first signal line on the base substrate, and/or the orthographic projection of one protection line on the base substrate is located in the orthographic projection of one of the second signal line on the base substrate, and/or the orthographic projection of one protection line on the base substrate is located in the orthographic projection of the adjacent two second signal lines on the base substrate respectively, and/or the orthographic projection of the adjacent two protection lines on the base substrate is located in the orthographic projection of one of the second signal line on the base substrate.

In some embodiments, the flexible array substrate comprises one signal line layer, or the flexible array substrate comprises a plurality of signal line layers, the plurality of signal line layers are stacked along the direction away from the base substrate, a first insulation layer is provided between the adjacent two signal line layers.

In some embodiments, each of the signal line layer comprises the at least one signal line, the orthographic projection of the protection layer on the base substrate has an overlapping region with the orthographic projection of the at least one signal line comprised by the at least one signal line layer.

In some embodiments, the at least one signal line layer comprises one signal line, the protection layer comprises a plurality of protection lines, the orthographic projection of the plurality of protection lines on the base substrate and the orthographic projection of one signal line comprised by the at least one signal line layer have an overlapping region, and/or the at least one signal line layer comprises a plurality of signal lines, the protection layer comprises a plurality of protection lines, the orthographic projections of the plurality of protection lines on the base substrate and the orthographic projections of the plurality of signal lines comprised by the at least one signal line layer have one-to-one correspondence overlapping region.

In some embodiments, a second insulation layer is provided between the protection layer and the at least one signal line.

In some embodiments, the at least one signal line comprises hollow-out patterns; and/or, the protection layer comprises hollow-out patterns.

In some embodiments, the protection layer mainly contains a conductive material.

In some embodiments, the protection line is electrically connected with the at least one signal line.

A second aspect of the present disclosure further provides a preparation method of flexible array substrate, comprising:

forming at least one signal line in the bending area of the base substrate, the bending area is adjacent to the active area;

forming a protection layer on the at least one signal line at a side away from the base substrate, an orthographic projection of the protection layer on the base substrate and an orthographic projection of the at least one signal line on the base substrate have an overlapping region, the Young's modulus of the protection layer is larger than or equal to the Young's modulus of the at least one signal line.

In some embodiments, the forming at least one signal line in the bending area of the base substrate comprises:

successively forming a first signal line, a first insulation layer and a second signal line in the bending area of the base substrate along the direction away from the base substrate, the first signal line and the second signal line both comprises hollow-out patterns.

In some embodiments, the forming a protection layer on the at least one signal line at a side away from the base substrate comprises:

forming a protection line on the at least one signal line at a side away from the base substrate, the protection line comprises hollow-out patterns, the extension direction of the protection line is coincided with the extension direction of the at least one signal line.

In some embodiments, after the forming at least one signal line in the bending area of the base substrate, and after the forming a protection layer on the at least one signal line at a side away from the base substrate, the preparation method of the base substrate further comprises:

forming a second insulation layer on the at least one signal line at a side away from the base substrate;

opening a via hole on the second insulation layer;

the forming a protection layer on the at least one signal line at a side away from the base substrate comprises:

forming a protection layer mainly containing a conductive material on the surface of the second insulation layer away from the at least one signal line, so that the at least one signal line is electrically connected with the protection layer through the via hole.

A third aspect of the present disclosure further provides a display device, comprising the above flexible array substrate.

BRIEF DESCRIPTION OF THE DRAWINGS

In order to describe technical solutions in embodiments of the present disclosure or in the prior art more clearly, the accompanying drawings to be used in the description of embodiments or the prior art will be introduced briefly. Obviously, the accompanying drawings to be described below are merely some embodiments of the present disclosure, and a person of ordinary skill in the art can obtain other drawings according to those drawings without paying any creative effort.

DETAILED DESCRIPTION

The technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Figure 1:
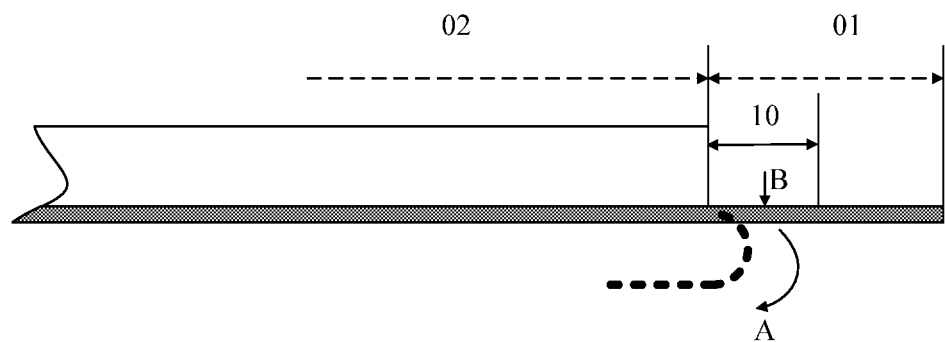
FIG. 1 is a structural schematic diagram of a flexible display device provided by the related art.
Figure 2:
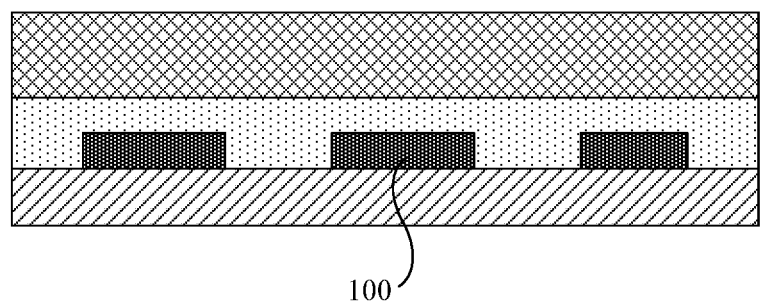
FIG. 2 is a schematic diagram of the section structure along arrow B in FIG. 1.

As shown in FIG. 1, in related art, the flexible display device comprises a wiring area 01 and an active area 02. A bending area 10 is disposed in a position of the wiring area 01 adjacent to the active area 02. The bending area 10 is bended, so that the flexible display device may be narrowly framed. FIG. 2 is a schematic diagram of section along the arrow B in FIG. 1. As shown in FIG. 2, the bending area 10 is provided with at least one signal line 100, such that the signal line 100 in the bending area 10 is easily broken during bending process (see the direction of arrow A in FIG. 1), resulting in a poor display of the flexible display device.

Regarding the above problem, some embodiments of the present disclosure provide an array substrate, the preparation method thereof, and a display device. The array substrate, the preparation method thereof, and a display device may reduce the breakage probability caused by the bending of the signal line in the bending area.

Figure 3:
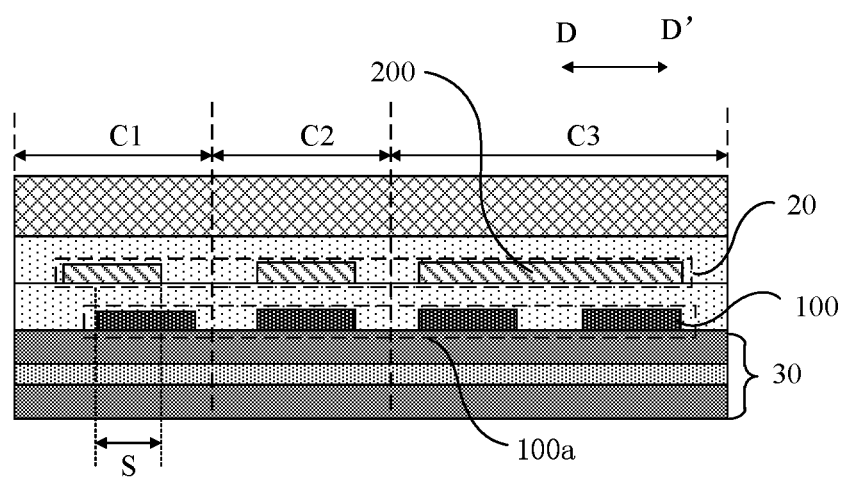
FIG. 3 is a structural schematic diagram of the first flexible array substrate provided by the embodiment of the present disclosure.

As shown in FIG. 1, some embodiments of the present disclosure provide a flexible array substrate. The flexible array substrate comprises a wiring area 01 and an active area 02. The wiring area 01 comprises a bending area 10 adjacent to the active area 02. As shown in FIG. 1 and FIG. 3, the bending area 10 comprises at least one signal line 100 and a protection layer 20. The signal line 100 and the protection layer 20 are both disposed on the base substrate 30. The protection layer is located on the signal line 100 at a side away from the base substrate 30. An orthographic projection of the protection layer 20 on the base substrate 30 have an overlapping region S with an orthographic projection of the signal line 100 on the base substrate 30. The Young's modulus of the protection layer 20 is larger than or equal to the Young's modulus of the signal line 100.

Since the protection layer 20 is located on the signal line 100 at a side away from the base substrate 30, the orthographic projection of the protection layer 20 on the base substrate 30 have an overlapping region with the orthographic projection of the signal line 100 on the base substrate 30, the Young's modulus of the protection layer 20 is larger than or equal to the Young's modulus of the signal line 100; therefore, the stress center of the signal line 100 can be adjusted by using the portion of the protection layer 20 corresponding to the overlapping region, so as to improve the stress homogeneity of different positions on the signal line, thereby, it can reduce the breakage probability of the signal line caused by the local stress concentration.

Moreover, since the above protection layer is located on the signal line at a side away from the base substrate, so that during the bending process, the protection layer may need to withstand large stresses to disperse the stress on the signal line; and, when the protection layer breaks due to the large stress, part of the stress may be released to better reduce the breakage probability of signal line caused by local stress concentration of the signal line.

In some embodiments, for the above flexible array substrate, the above base substrate 30 may generally be formed by flexible bendable materials (i.e. elastic materials).

For example, as shown in FIG. 3 to FIG. 8, the above base substrate may generally be composited by a first polyimide layer 310, a second polyimide layer 330 and an inorganic thin film layer 320. The inorganic thin film layer 320 is located between the first polyimide layer 310 and the second polyimide layer 330. The structure of the above base substrate 30 will not be limited hereto.

In some embodiments, the specific pattern shape of the protection layer 20 will not be limited. As an example, the specific pattern shape of the protection layer 20 may be a planar structure, or may be a lineage structure as shown in FIG. 3.

As shown in FIG. 3, when the specific pattern shape of the protection layer 20 is the lineage structure, the above protection layer 20 comprises at least one protection line 200 having an extension direction coincided with that of the signal line 100. The linear extension direction of the protection line 200 is the same as the extension direction of the signal line.

Figure 4:
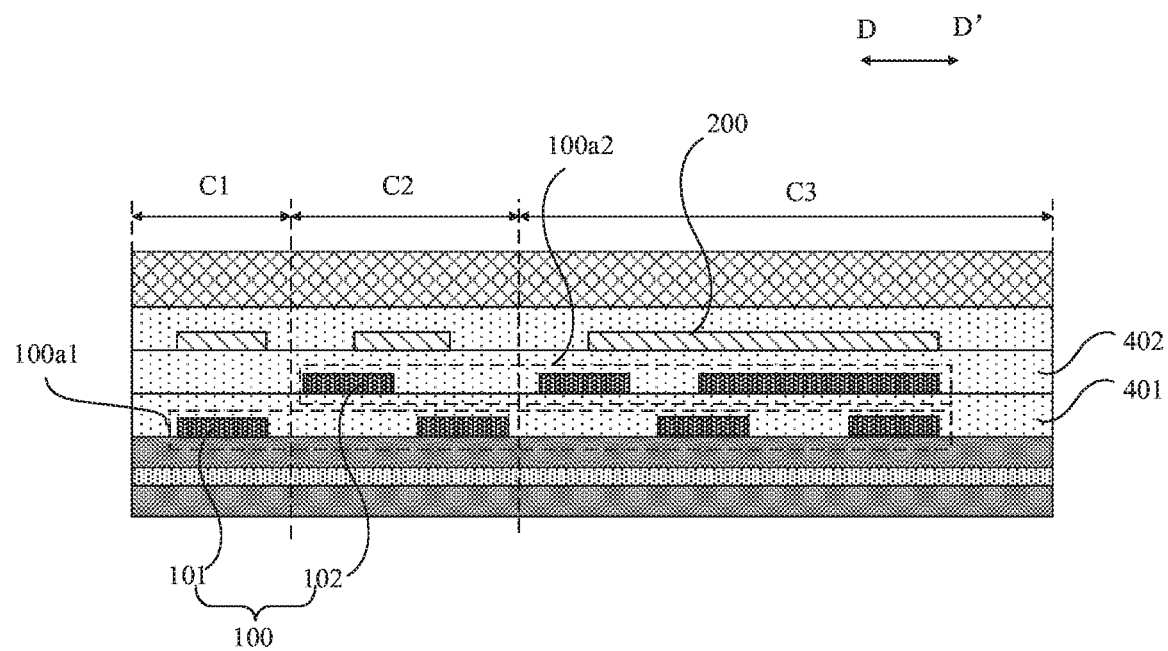
FIG. 4 is a structural schematic diagram of the second flexible array substrate provided by the embodiment of the present disclosure.

In some embodiments, considering that the surface of the planar protection layer 20 is prone to break under the condition that its surface has local unevenness, nonuniformity and so on, resulting that the protection effect of the protection layer 20 on the signal line 200 is significantly reduced. To this end, the protection layer 20 is the protection line 200. The extension direction of the protection line 200 is coincided with the extension direction of the signal line 100. In some embodiments, the above protection layer 20 may be one layer or multiple layers. And it will be not limited here. During the practical preparation process of the flexible array substrate, the number of layers of the protection layer may be selected according to practical requirements. Similarly, the signal line 100 may be one layer of signal line as shown in FIG. 3, or may be a plurality of different layers of signal lines 100 as shown in FIG. 4.

Optionally, considering the display device on the level of Quarter High Definition (QHD) requires more signals to support the display device for image display, the signal lines may be wired by using an arrangement of multilayer signal lines, to reduce the wiring density of the signal lines on the same layer, so that the risk of short circuit between two adjacent signal lines in the same layer may be reduced. In other words, using the arrangement of multilayer signal lines to wire the signal lines may optimize the wiring arrangement of the signal lines in high quality and picture display products. As shown in FIG. 3 to FIG. 8, the flexible array substrate comprises at least one signal line layer 100a. In other words, the flexible array substrate comprises one signal line layer 100a or comprises a plurality of signal line layers 100a. When the flexible array substrate comprises a plurality of signal line layers 100a, the plurality of signal line layers are stacked along the direction away from the base substrate, a first insulation layer is provided between the adjacent two signal line layers.

Each of the signal line layer 100a comprises the at least one signal line 100. The orthographic projection of the protection layer 20 on the base substrate 30 has an overlapping region with the orthographic projection of the signal line 100 comprised by at least one signal line layer 100a on the base substrate 30.

In one embodiment, the protection layer 20 in the flexible array substrate shown in FIG. 3 comprises the protection line having an extension direction coincided with that of the signal line 100, the flexible array substrate comprises one signal line layer 100a. The signal line layer 100a comprises a plurality of signal line 100. The overlapping region S of the orthographic projections of the protection layer 20 with the signal line 100 on the base substrate 30 refers that: in the first region C1 and the second region 02 of the FIG. 3, the orthographic projection of one protection line 200 on the base substrate 30 may have an overlapping region with the orthographic projection of one signal line 100 on the base substrate 30; in the third region C3 of the FIG. 3, the orthographic projection of one protection line 200 on the base substrate 30 also may have an overlapping region with the orthographic projection of two signal lines on the base substrate 30.

When one protection line 200 has an overlapping region with the orthographic projection of the at least one signal line 100 on the base substrate 30, in the second region 02 of FIG. 3, along the line width direction D-D' of the protection line 200, the boundary of the orthographic projections of the protection line 200 and that of the signal line 100 on the base substrate 30 may completely overlap (referring to the second region C2 in FIG. 3) or may partially overlap (referring to the first region C1 in FIG. 3), and it will not be limited here. In practical application, whether the boundary of the orthographic projections of the protection line 200 and that of the signal line 100 on the base substrate 30 is completely overlapped can be flexibly selected, and certainly, other overlapping method not listed may also be selected, and it will not be further described herein again.

In another implementation, the signal line in the flexible array substrate comprises two signal line layers. Two signal line layers comprise a first signal line layer 100a1 and a second signal line layer 100a2. The first signal line layer 100a1 comprises a plurality of first signal lines 101. The second signal line layer 100a2 comprises a plurality of second signal lines 102. The first signal line layer 100a1 is located on the second signal line layer 100a2 at a side adjacent to the base substrate 30, so that the first signal lines 101 comprised by the first signal line layer 100a1 is located on the second signal lines 102 comprised by the second signal line layer at a side adjacent to the base substrate. Certainly, it should be noted by the person skilled in the present field, for ensuring the insulation between the first signal line layer 100a1 and the second signal line layer 100a2, and for normal signal transmission, a first insulation layer 401 may be provided between the first signal line layer 100a1 and the second signal line layer 100a2. For example, as shown in FIG. 4, the first insulation layer 401 is provided between the layer where the first signal line 101 is located and the layer where the second signal line 102 is located.

The arrangement of the overlapping region of the orthographic projections of the protection layer 20 and the signal line 100 on the base substrate shown in FIG. 4 may be described with the reference to FIG. 3, as long as it is ensured that the orthographic projection of the protection line 200 on the base substrate has an overlapping region with the orthographic projection of the first signal line 101 comprised by the first signal line layer 100a1 and/or the second signal line 102 comprised by the second signal line layer 100a2 on the base substrate 30. As for the specific overlapping method, it can be selected according to practical requirements, and it will not be further described herein again.

As an example, since the portion where the orthographic projections of the protection layer 20 and the signal line 100 on the base substrate 30 is not overlapped has a small effect on improving the stress homogeneity of the signal line, in order to effectively use the protection layer 20 to adjust the stress and to homogenize the stress on the first signal line layer 100a1 and the second signal line layer 100a2, as shown in FIG. 4, along the width direction D-D' of the protection line 200, the orthographic projection of the protection line 200 on the base substrate 30 is located in the orthographic projection of the signal line 100 comprised by the plurality of signal line layers 100a on the base substrate 30.

As an example, as shown in FIG. 4, in the first region C1 in FIG. 4, along the width direction D-D' of the protection line 200, the above orthographic projection of the protection line 200 on the base substrate 30 may be located in the orthographic projection of one signal line comprised by the first signal line layer 100a1 on the base substrate.

In the second region C2 and the third region 03 of the FIG. 4, along the width direction D-D' of the protection line 200, the orthographic projection of the protection line 200 on the base substrate 30 may be located in the orthographic projections of two signal lines on the base substrate. Optionally, along the width direction D-D' of the protection line 200, the orthographic projection of the protection line 200 on the base substrate 30 may be located in the orthographic projections of two signal line comprised by the same one signal line layer 100a (referring to the third region C3 in FIG. 4), or may be located in the orthographic projection of the signal lines comprised by two different signal line layers 100a on the base substrate (referring to the second region 02 in FIG. 4). In addition, in the second region C2 and the third region C3 of FIG. 4, the protection line 200 has partial region where orthographic projection of the protection line 200 on the base substrate has no overlapping region with the orthographic projection of the signal line 100 on the base substrate.

It should be noted that, in the arrangement means of the protection line 200 and the signal line 100 as shown in the second region 02 and the third region 03 of FIG. 4, the signal lines originally disposed on the same layer are divided into two layers, so as to reduce the number of the signal lines in the same layer, so that the width of the signal lines in each layer may be increased appropriately. Therefore, dividing the signal lines originally disposed on the same layer into two layers can reduce the preparation accuracy of the signal line. Thereby, the base substrate with a large number of signal lines may be disposed by selecting the method in the second region 02 and the third region 03 in FIG. 4. Hereinafter, taking the flexible array substrate comprising the first signal line layer 100a1 and the second signal line layer 100a2 as an example, the projection relationship between the protection line 200 and the signal line 100 will be further described.

In order to effectively use the protection line 200 to adjust the stress center of the first signal line 101 comprised by the first signal line 100a1, and to realize the improvement of the stress homogeneity of the first signal line layer 100a, the protection line 200 and the first signal line 100a may be projected as following.

Figure 7:
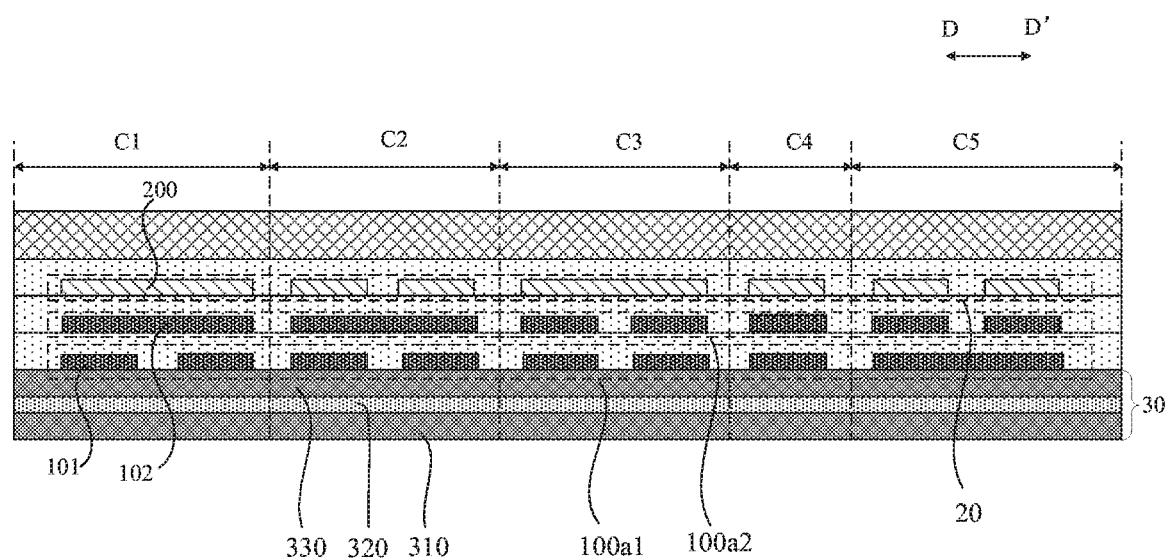
FIG. 7 is a structural schematic diagram of the fifth flexible array substrate provided by the embodiment of the present disclosure.

The first projection method: in the second region 02 and the fourth region 04 of FIG. 7, along the width direction D-D' of the protection line 200, the orthographic projection of one protection line 200 on the base substrate 30 may be located in the orthographic projection of one of the first signal line 101 comprised by the first signal line layer 100a1 on the base substrate 30.

The second projection method: in the first region C1 and the third region C3 of FIG. 7, along the width direction D-D' of the protection line 200, the orthographic projection of one protection line 200 on the base substrate 30 may be located in the orthographic projections of adjacent two first signal lines 101 on the base substrate.

It should be noted that, the number of the protection line 200 comprised by the above protection layer 20 may be one or more.

In some embodiments, as shown in FIG. 3 and FIG. 7, when the number of the protection line 200 comprised by the above protection layer 20 is one, at least one signal line layer 100a comprises one signal line 100. The orthographic projection of the plurality of protection lines on the base substrate has overlapping region with the orthographic projection of one signal line comprised in the at least one signal line layer 100a on the base substrate.

As an example, in the fifth region C5 of FIG. 7, along the width direction D-D' of the protection line 200, the orthographic projections of adjacent two protection lines 200 on the base substrate 30 are located in the orthographic projection of one of the first signal line 101 on the base substrate, so that the orthographic projection of two outer boundaries of adjacent two protection lines 200 on the base substrate 30 may be located in the orthographic projection of one of the first signal line 101 on the base substrate 30. Along the width direction D-D' of the protection line 200, the two outer boundaries of adjacent two protection line 200 refer to two boundaries away from the adjacent side in the adjacent two protection lines 200 along the width direction D-D' of the protection line 200.

In some embodiments, when the number of the protection line 200 comprised by the above protection layer 20 is plural, at least one signal line layer 100a comprises a plurality of the signal lines 100. In this case, the orthographic projections of the plurality of protection lines on the base substrate are one-to-one correspondingly located in the orthographic projections of the plurality of signal line comprised by the at least one signal line layer 100a on the base substrate. As an example, in the second region C2 of FIG. 7, along the width direction of the protection line 200, the orthographic projections of adjacent two protection lines 200 on the base substrate are one-to-one correspondingly located in the orthographic projections of two first signal lines 101 comprised by the first signal line layer 101a1 on the base substrate.

It should be noted that, the boundary of one protection line 200 in the flexible array substrate as shown in FIG. 7 overlaps with the boundary of the orthographic projection of the first signal line 101 on the base substrate, but it will be not limited herein, the specific disposition may refer to the above related details in the present embodiment. The projection relation between the protection line 200 and the first signal line 101 in flexible array substrate as shown in FIG. 7 is not just limited to the projection relation of this one protection line 200 corresponding to two first signal lines 101, or the projection relation of two protection lines 200 corresponding to one first signal line 101, and in practice, the projection relation may be configured that one protection line 200 correspond more than two first signal lines 101, or more than two protection lines 200 correspond one first signal line 101, and it will not be limited here. In order to illustrate the projection relation between the protection line and the first signal line, FIG. 7 shows a plurality of projection relation of the flexible array substrate containing the protection line and the first signal line. As practically preparing the flexible array substrate, one projection relation or combination of several projection relations in the first region C1, the second region C2, the third region C3, the fourth region C4, and the fifth region 05 of FIG. 7 may be selected to dispose the protection line and the first signal line.

In some embodiments, the projection relation between the protection line 200 and the second signal line layer 100a2 may be described referring to the projection relations between the protection line 200 and the first signal line layer 100a2 shown in each region of FIG. 7. In other words, there are several projection relations between the protection line 200 and the second signal line layer 100a2 as following.

The first projection relation: along the width direction D-D' of the protection line 200, the orthographic projection of one protection line 200 on base substrate 30 is located in the orthographic projection of one of the second signal line 102 on the base substrate 30.

The second projection relation: along the width direction D-D' of the protection line 200, the orthographic projection of one protection line 200 on base substrate 30 is located in the orthographic projections of adjacent two second signal line 102 on the base substrate 30.

The third projection relation: along the width direction D-D' of the protection line 200, the orthographic projections of adjacent two protection lines 200 on base substrate 30 are located in the orthographic projection of one of the second signal line 102 on the base substrate 30.

In practical wiring, the stress center may be adjusted according to the adjustment of the disposition of the relative location between the first signal line layer 100a1 and the second signal line layer 100a2, so as to improve the stress homogeneity of the two signal line layers 100a. The dispositions of the relative location between the first signal line layer 100a1 and the second signal line layer 100a2 may comprises the following conditions.

Figure 8:
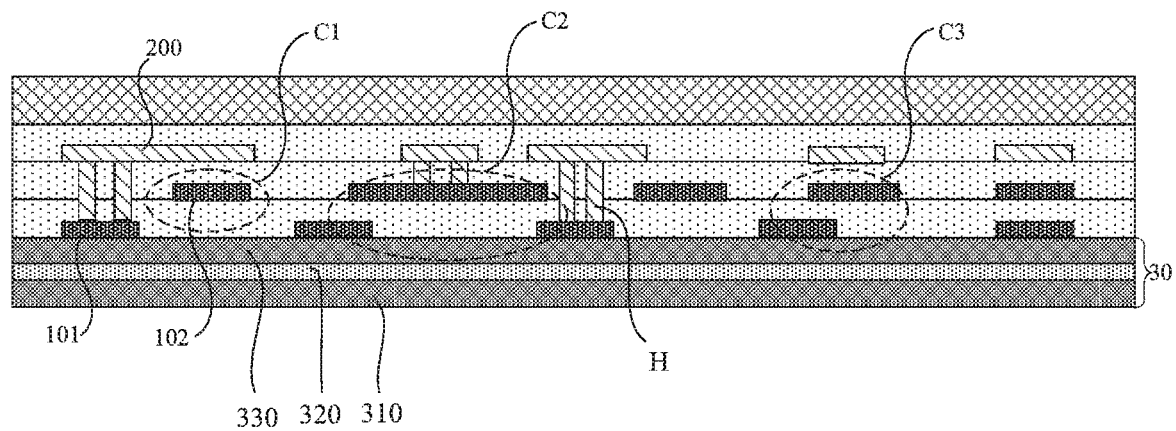
FIG. 8 is a structural schematic diagram of the sixth flexible array substrate provided by the embodiment of the present disclosure.

The first condition: in the first region C1 in FIG. 8, the orthographic projections of the first signal line 101 and the second signal line 102 on the base substrate 30 are independent to each other, so that the orthographic projections of the first signal line 101 and the second signal line 102 on the base substrate 30 do not have an overlapping region.

The second condition: in the second region C2 and the third region C3 of FIG. 8, the orthographic projections of the first signal line 101 and the second signal line 102 on the base substrate 30 have an overlapping region.

In this case, in the second region C2 of FIG. 8, the orthographic projections of one of the second signal line 102 and that of a plurality of first signal lines 101 on the base substrate 30 may have an overlapping region, or in the third region C3 of FIG. 8, the orthographic projections of one of the second signal line 102 and one of the first signal lines 101 on the base substrate 30 may have an overlapping region. The overlapping relation between the first signal line and the second signal line will not be limited, and it can be selected according to the practical requirements. Certainly, in order to reduce the signal interference problem caused by the overlapping between the first signal line 101 and the second signal line 102 as much as possible, the overlapping region in the orthographic projections of the first signal line 101 and the second signal line 102 on the base substrate 30 may be reduced in practical preparation.

In some embodiments, on the basis that the above protection line 200 satisfies the above arrangement conditions (it has an overlapping region with the orthographic projection of the signal line on the base substrate 30, and its Young's modulus is larger than or equal to the Young's modulus of the signal line), the above protection line 200 may mainly be constituted by conductive materials, or by non-conductive materials, and it will be not limited hereto. During the practical preparation process of the array substrate, since the non-conductive layer (insulation layer) is generally prepared by resins or inorganic materials, its Young's modulus is generally small. However, the conductive layer (electrode, or signal line) is generally prepared by metals, transparent conductive materials, and its Young's modulus is generally large. Therefore, the above protection line 200 may mainly be constituted by conductive materials. In this way, when a certain conductive pattern layer in the active area is prepared, the protection line is simultaneously formed by one patterning process, so as to avoid additional preparation process of the protection line. Thereby, the preparation process is simplified and the preparation cost is reduced.

In some embodiments, the above protection line may be prepared with the conductive pattern layer in the active area by one patterning process, which specifically comprises the following implementation methods, but it will not be limited herein. In practical preparation, it can be disposed according to the type of the array substrate and the practical requirements.

The first implementation method: the above protection line may be prepared with the transparent electrode in the active area by one patterning process, so that the protection line may be constituted by transparent conductive material (such as Indium tin oxide, ITO).

The second implementation method: the above protection line may be prepared with the reflected electrode (for OLED display devices) in the active area by one patterning process, so that the protection line may be constituted by metal material.

The third implementation method: the above protection line may be prepared with other conductive film layers (other conductive film layers except the transparent electrode, and the reflected electrode, such as a gate layer) in the active area by one patterning process, so that the protection line may be constituted by metal material. In some embodiments, as shown in FIG. 4, a second insulation layer is provided between the protection line 200 and the signal line 100; also as shown in FIG. 5, the protection line 200 may be in direct contact with the signal line 100 (such as the second signal line 102 in the signal line 100), and it will not be limited herein, and may be disposed according to the practical requirements.

As an example, as shown in FIG. 4, when the flexible array substrate comprises the first signal line layer 100a1 and the second signal line layer 100a2, a first insulation layer 401 is also provided between the first signal line 101 and the second signal line 102. Second insulating layers 402 are disposed between the protection line 200 and the first signal line 101 and between the protection line 200 the second signal line 102, in this case, two insulation layers are provided between the protection line 200 and the first signal line layer 100a1.

In some embodiments, the above protection line 200 mainly contains conductive materials.

Figure 5:
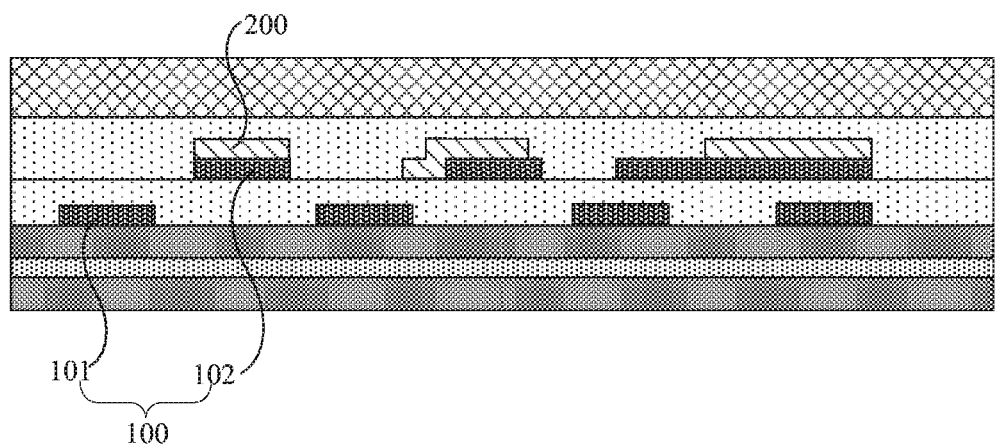
FIG. 5 is a structural schematic diagram of the third flexible array substrate provided by the embodiment of the present disclosure.

As an example, the protection line 200 in the flexible array substrate as shown in FIG. 5 direct contact with the signal line 100, wherein, the protection line may not only adjust the stress center to improve the stress homogeneity of different positions of the signal line, but also to reduce the resistance of the signal line, so as to reduce the signal attenuation problem caused by the resistance of the signal line.

As an example, in the flexible array substrate shown in FIG. 4, the second insulation layer 402 is disposed between the protection line 200 and the signal line 100, wherein, the protection line may not only adjust the stress center to improve the stress homogeneity of different positions of the signal line, and to reduce the resistance of the signal line. The protection line 200 is electrically connected with the signal line 100 by opening a via hole on the insulation layer in the flexible array substrate shown in FIG. 4.

Figure 6:
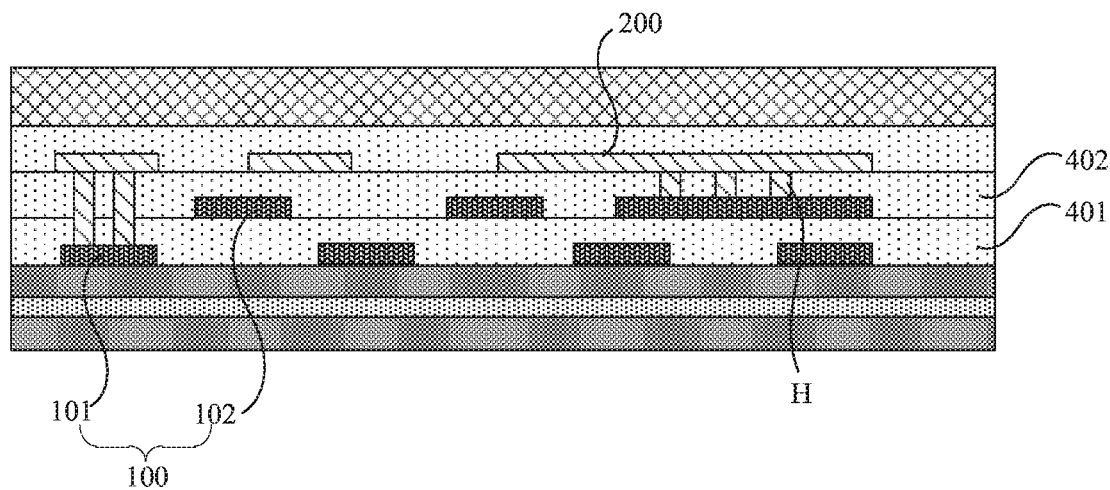
FIG. 6 is a structural schematic diagram of the fourth flexible array substrate provided by the embodiment of the present disclosure.

As an example, the signal line 100 in the flexible array substrate shown in FIG. 6 comprises a first signal line 101 and a second signal line 102. The protection line 200 is electrically connected with the second signal line 102 through the via hole on one insulation layer, and/or, is electrically connected with the first signal line 101 through the via hole H on two insulation layers.

It should be noted that, FIG. 6 schematically illustrates the electrical connection method between the protection line and the signal line. The electrical connection method between the protection line 200 and the signal line 100 may be selected according to the requirements in practice, and it will not be limited in the present disclosure.

Certainly, it should be understood by the person skilled in the present field, in order to ensure that each signal line can transmit signals normally, it should be ensured that one protection line 200 may only be connected with one signal line 100, so as to avoid the short circuit problem caused by the connection between the signal line 100 and a plurality of protection lines 200.

Figure 9:
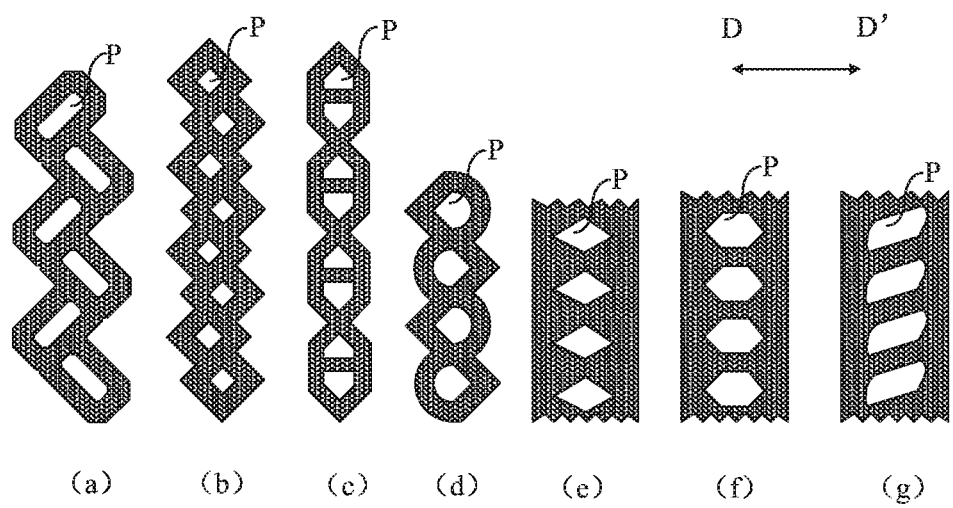
FIG. 9 is a structural schematic diagram of the hollow-out patterns in the embodiment of the present disclosure.

In some embodiments, when the bending area is bent along the direction of the base substrate away from the signal line and the protection layer, for improving the bending resistance of the signal line, and for reducing the breakage probability of the signal line, as shown in FIG. 9, hollow-out patterns are disposed on the signal line 100, so that the signal line 100 comprises hollow-out patterns. Similarly, hollow-out patterns P may be disposed on the above protection line 200 as the same, so that the protection line 200 comprises hollow-out patterns.

Seven different hollow-out patterns P are shown in FIG. 9(*a*), (*b*), (*c*), (*d*), (*e*), (*f*), and (*g*) respectively, but it will not be limited herein. Other type of hollow-out patterns with bending resistance may also be provided. Certainly, the outer contour of the wiring also requires being adapted to different hollow patterns, which will not be described here.

Taking the signal line as an example, during the practical preparation process, the hollow-out pattern shape required for the signal line can be selected according to the specific requirements of the signal line.

As an example, hollow-out patterns with tensile resistance may be selected to dispose for the position where the tensile stress of the signal line is concentrated. The hollow-out pattern with tensile resistance comprises the hollow-out patterns shown in (a), (b), (c), and (d) of FIG. 9. Hollow-out patterns with compression resistance may be selected to dispose for the position where the pressure stress of the signal line is concentrated. The hollow-out pattern with compression resistance comprises the hollow-out patterns shown in (e), (f) and (g) of FIG. 9. For the position where the signal line is subjected to tensile stress and compressive stress at the same time, it is possible to select to alternatively dispose the hollow-out patterns with tensile resistance and the hollow-out patterns with compression resistance. For example, one or more of the hollow-out patterns in (a), (b) and (c) of FIG. 9 may be alternatively disposed with one or more of the hollow-out patterns in (e), (f) and (g) of FIG. 9; certainly, hollow-out patterns in (a), (b), (c), and (d) of FIG. 9 also have compression resistance to a certain extent. Therefore, for the position subjected to tensile stress and compressive stress, one or more of the hollow-out patterns in (a), (b), (c), and (d) of FIG. 9 may also be adopted, which will not be limited hereto.

In addition, it should be understood by person skilled in the present field, the flexible array substrate provided by the embodiments of the present disclosure is at least applied to an OLED (Organic Light Emitting Diode) display screen, and it is also applicable to part of display screens with flexible base LCD (Liquid Crystal Display).

Figure 12:
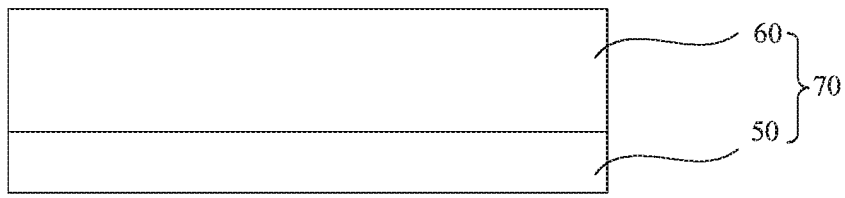
FIG. 12 is a structural schematic diagram of the display device provided by some embodiments of the present disclosure.

As shown in FIG. 12, some embodiments of the present disclosure provide a display device 70. The display device 70 comprises the above flexible array substrate 50.

Compared with the related art, the beneficial effect of the display device 70 provided by some embodiments of the present disclosure is the same with the beneficial effect of the above flexible array substrate 50, and it will not be further described here again.

Figure 11:
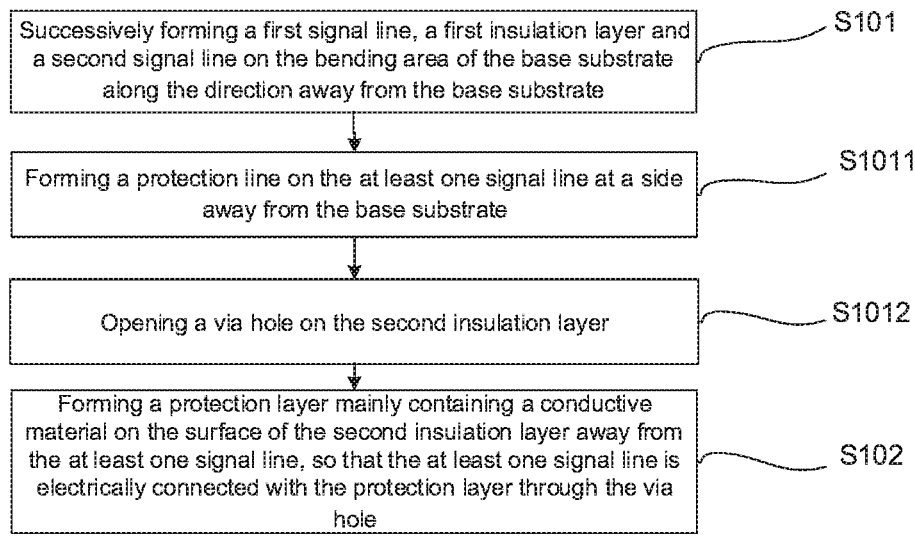
FIG. 11 is a flow chat 2 of the preparation method of the flexible array substrate provided by some embodiments of the present disclosure.

In some embodiments, as shown in FIG. 11, the display device provided by the embodiments of the present disclosure may at least comprises an organic light-emitting diode display panel 60. The organic light-emitting diode display panel 60 may be applied to digital photo frames, mobile phones, tablet computers or other products or components with display function.

Figure 10:
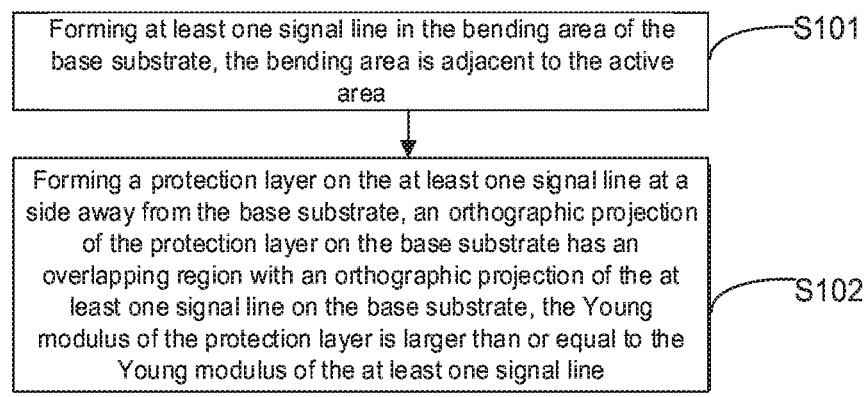
FIG. 10 is a flow chat 1 of the preparation method of the flexible array substrate provided by some embodiments of the present disclosure.

Some embodiments of the present disclosure provide a preparation method of the flexible array substrate. The array substrate comprises an active area and a wiring area. Referring to FIG. 1, FIG. 3 and FIG. 4, as shown in FIG. 10, the preparation method of the flexible array substrate comprises:

S101: forming at least one signal line 100 in a bending area 10 of the base substrate 30. The base substrate comprises an active area 02 and the bending area 10 adjacent to the active area 02. The active area 02 is adjacent to the bending area 10.

S102: forming a protection layer 20 on the signal line 100 at a side away from the base substrate 30. An orthographic projection of the protection layer 20 on the base substrate 30 has an overlapping region with an orthographic projection of the signal line 100 on the base substrate 30. The Young's modulus of the protection layer 20 is larger than or equal to the Young's modulus of the signal line 100.

Compared with the related art, the beneficial effect of the preparation method of the flexible array substrate provided by the embodiment of the present disclosure is the same with the beneficial effect of the above flexible array substrate, which will not be further described here again.

In some embodiments, the above base substrate 30 does not absolutely refer to a single base substrate. According to the type of the practical flexible array substrate, the base substrate may further be provided with other film layers, for example, an active pattern layer, a gate pattern layer, a gate insulation layer pattern layer, and interlamination dielectric layer etc. are formed in the active area 02 on the base substrate.

Certainly, in the case that the protection layer 20 is conductive material, before forming the production layer 20, an insulation layer should be formed on the signal line 100; and an insulation layer should be formed after forming the protection layer 20. And of course, after the insulation layer, a resin layer for encapsulation is generally formed.

In some embodiments, as shown in FIG. 4, FIG. 9, and FIG. 11, the above forming at least one signal line in the bending area of the base substrate comprises:

Successively forming a first signal line 101, a first insulation layer 401 and a second signal line 102 in the bending area 10 of the base substrate 30 along the direction away from the base substrate 30. The first signal line 101 and the second signal line 102 both comprise hollow-out patterns P.

During forming the first signal line 101 and the second signal line 102, a mask may be designed according to the shape of the hollow-out patterns P, and the width value (CD) of the signal line, afterwards, while the signal line (the first signal line 101 or the second signal line 102) is formed by one patterning process, the hollow-out patterns disposed by the signal line 100 are formed.

In some embodiments, the above forming a protection layer 20 on the signal line 100 at a side away from the base substrate 30 comprises:

forming a protection layer 200 on the signal line 100 at a side away from the base substrate 30. The protection line comprises hollow-out patterns P. The extension direction of the protection line is coincided with the extension direction of the signal line 100.

During the process of forming the protection layer 20, a mask may be designed according to the shape of the hollow-out pattern P, and the width value (CD) of the protection line, afterwards, while the protection line 200 is formed by one patterning process, the hollow-out patterns disposed by the signal line 100 are formed.

In some embodiments, after the forming the signal line in the bending area of the base substrate, and before forming the protection layer on the signal line at a side away from the base substrate, the preparation method of the base substrate further comprises:

S1011: forming a second insulation layer 402 on the at least one signal line at a side away from the base substrate 30;

S1012: opening a via hole H shown in FIG. 8 on the second insulation layer 402.

S102: forming a protection layer 20 on the at least one signal line 100 at a side away from the base substrate 30 comprises:

the protection layer 20 mainly containing conductive materials is formed on the surface of the second insulation layer 402 away from the at least one signal line, so that the at least one signal line is electrically connected with the protection layer 20 through the via hole H.

In addition, other disposition in the preparation method of the flexible array substrate may refer to the special structure of the above flexible array substrate. An appropriate process may be selected, which will not be further described here again.

In some embodiments, the corresponding patterning process may be selected according to the structure formed in the present disclosure. For example: the patterning process comprises a photolithographic process and/or an etching process. The etching process may be dry etching or wet etching. The above patterning process may further comprises printing, ink jet and other process used for forming a predetermined pattern. The photolithographic process refers to the process of forming patterns using film forming equipment, mask and exposure machine, etc.

The above description is only the specific embodiment of the present disclosure, but the scope of the present disclosure is not limited thereto, and any person skilled in the art can easily think of changes or replacement intended to be covered by the scope of the present disclosure within the technical scope disclosed by the present disclosure. Therefore, the scope of protection of the present disclosure should be determined by the scope of the appending claims.

What is claimed is:

1. A flexible array substrate, comprising an active area and a bending area, wherein, the bending area is adjacent to the active area, the bending area comprises a protection layer and at least one signal line disposed on a base substrate, the protection layer is located on the at least one signal line at a side away from the base substrate, and a second insulation layer is provided between the protection layer and the at least one signal line;

an orthographic projection of the protection layer on the base substrate has an overlapping region with an orthographic projection of the at least one signal line on the base substrate, the Young's modulus of the protection layer is larger than or equal to the Young's modulus of the at least one signal line;

the protection layer mainly contains a conductive material, the protection layer comprises a plurality of protection lines, at least one protection line of the plurality of protection lines is electrically connected with the at least one signal line through a via hole, and the plurality of protection lines have a same extension direction with the at least one signal line;

the at least one signal line comprises at least one first signal line and at least one second signal line located on different layers, the at least one first signal line is located on a side of the at least one second signal line, and the side is adjacent to the base substrate;

an orthographic projection of one of the plurality of protection lines on the base substrate is located in the orthographic projection of two adjacent first signal lines on the base substrate, and/or an orthographic projection of two adjacent protection lines of the plurality of protection lines on the base substrate is located in the orthographic projection of one of the at least one first signal line on the base substrate, and/or the orthographic projection of one of the plurality of protection lines on the base substrate is located in the orthographic projection of two adjacent second signal lines on the base substrate respectively, and/or the orthographic projection of two adjacent protection lines of the plurality of protection lines on the base substrate is located in the orthographic projection of one of the at least one second signal line on the base substrate; and the at least one protection line is the plurality of protection lines are different from the at least one signal line.

2. The flexible array substrate according to claim 1, wherein, the orthographic projection of the boundary of the at least one protection line of the plurality of protection lines on the base substrate is located in the orthographic projection of the at least one signal line on the base substrate.

3. The flexible array substrate according to claim 1, wherein, the flexible array substrate comprises one signal line layer, or the flexible array substrate comprises a plurality of signal line layers, the plurality of signal line layers are stacked along the direction away from the base substrate, a first insulation layer is provided between the adjacent two signal line layers.

4. The flexible array substrate according to claim 3, wherein, each of the signal line layers comprises the at least one signal line, the orthographic projection of the protection layer on the base substrate has an overlapping region with the orthographic projection of the at least one signal line comprised by the at least one signal line layer.

5. The flexible array substrate according to claim 3, wherein,
the at least one signal line layer comprises one signal line, the orthographic projection of the plurality of protection lines on the base substrate and the orthographic projection of the one signal line comprised by the at least one signal line layer have an overlapping region, and/or
the at least one signal line layer comprises a plurality of signal lines, the orthographic projections of the plurality of protection lines on the base substrate and the orthographic projections of the plurality of signal lines comprised by the at least one signal line layer have one-to-one correspondence overlapping region.

6. The flexible array substrate according to claim 1, wherein, the at least one signal line comprises hollow-out patterns; and/or, the protection layer comprises hollow-out patterns.

7. A display device, comprising the flexible array substrate of claim 1.

8. A preparation method of a flexible array substrate, the flexible array substrate comprises an active area and a bending area, wherein:
the bending area is adjacent to the active area, the bending area comprises a protection layer and at least one signal line disposed on a base substrate, the protection layer is located on the at least one signal line at a side away from the base substrate, and a second insulation layer is provided between the protection layer and the at least one signal line;
an orthographic projection of the protection layer on the base substrate has an overlapping region with an orthographic projection of the at least one signal line on the base substrate, the Young's modulus of the protection layer is larger than or equal to the Young's modulus of the at least one signal line;
the protection layer mainly contains a conductive material, the protection layer comprises a plurality of protection lines, at least one protection line of the plurality of protection lines is electrically connected with the at least one signal line through a via hole, and the plurality of protection lines have a same extension direction with the at least one signal line;
the at least one signal line comprises at least one first signal line and at least one second signal line located on different layers, the at least one first signal line is located on a side of the at least one second signal line, and the side is adjacent to the base substrate;
an orthographic projection of one of the plurality of protection lines on the base substrate is located in the orthographic projection of two adjacent first signal lines on the base substrate, and/or
an orthographic projection of two adjacent protection lines of the plurality of protection lines on the base substrate is located in the orthographic projection of one of the at least one first signal line on the base substrate, and/or
the orthographic projection of one of the plurality of protection lines on the base substrate is located in the orthographic projection of two adjacent second signal lines on the base substrate respectively, and/or
the orthographic projection of two adjacent protection lines of the plurality of protection lines on the base substrate is located in the orthographic projection of one of the at least one second signal line on the base substrate; and
the plurality of protection lines are different from the at least one signal line,
wherein the preparation method comprises:
forming the at least one signal line in the bending area of the base substrate, the bending area is adjacent to the active area;
forming the second insulation layer on the at least one signal line at a side away from the base substrate, and opening a via hole on the second insulation layer;
forming the protection layer on a side of the second insulation layer which is away from the base substrate, wherein the orthographic projection of the protection layer on the base substrate has the overlapping region with the orthographic projection of the at least one signal line on the base substrate, the Young's modulus of the protection layer is larger than or equal to the Young's modulus of the at least one signal line,
wherein forming the protection layer on a side of the second insulation layer which is away from the base substrate comprises:
forming the plurality of protection lines mainly containing a conductive material on the side of the second insulation layer which is away from the at least one signal line, so that the at least one signal line is electrically connected with at least one protection line of the plurality of protection lines through the via hole, wherein the plurality of protection lines have a same extension direction with the at least one signal line, and the plurality of protection lines are different from the at least one signal line.

9. The preparation method of the flexible array substrate according to claim 8, wherein forming at least one signal line in the bending area of the base substrate comprises:
forming at least one first signal line, a first insulation layer and at least one second signal line in the bending area of the base substrate successively along the direction away from the base substrate, the at least one first signal line and the at least one second signal line both comprise hollow-out patterns.

10. The preparation method of the flexible array substrate according to claim 8, wherein
the plurality of protection lines comprise hollow-out patterns.

* * * * *

UNITED STATES PATENT AND TRADEMARK OFFICE
CERTIFICATE OF CORRECTION

PATENT NO. : 10,964,727 B2  
APPLICATION NO. : 16/133313  
DATED : March 30, 2021  
INVENTOR(S) : Peng Huang et al.

Page 1 of 3

It is certified that error appears in the above-identified patent and that said Letters Patent is hereby corrected as shown below:

In the Specification

Column 5, Line 66 should read:
In one embodiment, the protection layer 20 in the flexible array substrate shown in Fig. 3 comprises the protection line having an extension direction coincided with that of the signal line 100, the flexible array substrate comprises one signal line layer 100a. The signal line layer 100a comprises a plurality of signal line 100. The overlapping region S of the orthographic projections of the protection layer 20 with the signal line 100 on the base substrate 30 refers that: in the first region C1 and the second region C2 of the Fig. 3, the orthographic projection of one protection line 200 on the base substrate 30 may have an overlapping region with the orthographic projection of one signal line 100 on the base substrate 30; in the third region C3 of the Fig. 3, the orthographic projection of one protection line 200 on the base substrate 30 also may have an overlapping region with the orthographic projection of two signal lines on the base substrate 30.

Column 6, Line 16 should read:
When one protection line 200 has an overlapping region with the orthographic projection of the at least one signal line 100 on the base substrate 30, in the second region C2 of Fig. 3, along the line width direction D-D' of the protection line 200, the boundary of the orthographic projections of the protection line 200 and that of the signal line 100 on the base substrate 30 may completely overlap (referring to the second region C2 in Fig. 3) or may partially overlap (referring to the first region C1 in Fig. 3), and it will not be limited here. In practical application, whether the boundary of the orthographic projections of the protection line 200 and that of the signal line 100 on the base substrate 30 is completely overlapped can be flexibly selected, and certainly, other overlapping method not listed may also be selected, and it will not be further described herein again.

Signed and Sealed this  
Fourteenth Day of September, 2021

Drew Hirshfeld  
*Performing the Functions and Duties of the  
Under Secretary of Commerce for Intellectual Property and  
Director of the United States Patent and Trademark Office*

Column 7, Line 17 should read:
In the second region C2 and the third region C3 of the Fig. 4, along the width direction D-D' of the protection line 200, the orthographic projection of the protection line 200 on the base substrate 30 may be located in the orthographic projections of two signal lines on the base substrate. Optionally, along the width direction D-D' of the protection line 200, the orthographic projection of the protection line 200 on the base substrate 30 may be located in the orthographic projections of two signal line comprised by the same one signal line layer 100a (referring to the third region C3 in Fig. 4), or may be located in the orthographic projection of the signal lines comprised by two different signal line layers 100a on the base substrate (referring to the second region C2 in Fig. 4). In addition, in the second region C2 and the third region C3 of Fig. 4, the protection line 200 has partial region where orthographic projection of the protection line 200 on the base substrate has no overlapping region with the orthographic projection of the signal line 100 on the base substrate.

Column 7, Line 36 should read:
It should be noted that, in the arrangement means of the protection line 200 and the signal line 100 as shown in the second region C2 and the third region C3 of Fig. 4, the signal lines originally disposed on the same layer are divided into two layers, so as to reduce the number of the signal lines in the same layer, so that the width of the signal lines in each layer may be increased appropriately. Therefore, dividing the signal lines originally disposed on the same layer into two layers can reduce the preparation accuracy of the signal line. Thereby, the base substrate with a large number of signal lines may be disposed by selecting the method in the second region C2 and the third region C3 in Fig.4. Hereinafter, taking the flexible array substrate comprising the first signal line layer 100a1 and the second signal line layer 100a2 as an example, the projection relationship between the protection line 200 and the signal line 100 will be further described.

Column 7, Line 59 should read:
The first projection method: in the second region C2 and the fourth region C4 of Fig. 7, along the width direction D-D' of the protection line 200, the orthographic projection of one protection line 200 on the base substrate 30 may be located in the orthographic projection of one of the first signal line 101 comprised by the first signal line layer 100a1 on the base substrate 30.

Column 8, Line 45 should read:
It should be noted that, the boundary of one protection line 200 in the flexible array substrate as shown in Fig. 7 overlaps with the boundary of the orthographic projection of the first signal line 101 on the base substrate, but it will be not limited herein, the specific disposition may refer to the above related details in the present embodiment. The projection relation between the protection line 200 and the first signal line 101 in flexible array substrate as shown in Fig. 7 is not just limited to the projection relation of this one protection line 200 corresponding to two first signal lines 101, or the projection relation of two protection lines 200 corresponding to one first signal line 101, and in practice, the projection relation may be configured that one protection line 200 correspond more than two first signal lines 101, or more than two protection

CERTIFICATE OF CORRECTION (continued)
U.S. Pat. No. 10,964,727 B2 lines 200 correspond one first signal line 101, and it will not be limited here. In order to illustrate the projection relation between the protection line and the first signal line, Fig. 7 shows a plurality of projection relation of the flexible array substrate containing the protection line and the first signal line. As practically preparing the flexible array substrate, one projection relation or combination of several projection relations in the first region C1, the second region C2, the third region C3, the fourth region C4, and the fifth region C5 of Fig. 7 may be selected to dispose the protection line and the first signal line.

In the Claims

Claim 1 should read:
1. A flexible array substrate, comprising an active area and a bending area, wherein,
    the bending area is adjacent to the active area, the bending area comprises a protection layer and at least one signal line disposed on a base substrate, the protection layer is located on the at least one signal line at a side away from the base substrate, and a second insulation layer is provided between the protection layer and the at least one signal line;
    an orthographic projection of the protection layer on the base substrate has an overlapping region with an orthographic projection of the at least one signal line on the base substrate, the Young's modulus of the protection layer is larger than or equal to the Young's modulus of the at least one signal line;
    the protection layer mainly contains a conductive material, the protection layer comprises a plurality of protection lines, at least one protection line of the plurality of protection lines is electrically connected with the at least one signal line through a via hole, and the plurality of protection lines have a same extension direction with the at least one signal line;
    the at least one signal line comprises at least one first signal line and at least one second signal line located on different layers, the at least one first signal line is located on a side of the at least one second signal line, and the side is adjacent to the base substrate;
    an orthographic projection of one of the plurality of protection lines on the base substrate is located in the orthographic projection of two adjacent first signal lines on the base substrate, and/or
    an orthographic projection of two adjacent protection lines of the plurality of protection lines on the base substrate is located in the orthographic projection of one of the at least one first signal line on the base substrate, and/or
    the orthographic projection of one of the plurality of protection lines on the base substrate is located in the orthographic projection of two adjacent second signal lines on the base substrate respectively, and/or
    the orthographic projection of two adjacent protection lines of the plurality of protection lines on the base substrate is located in the orthographic projection of one of the at least one second signal line on the base substrate; and
    is the plurality of protection lines are different from the at least one signal line.